US008780015B2

(12) United States Patent
Watanabe

(10) Patent No.: US 8,780,015 B2
(45) Date of Patent: Jul. 15, 2014

(54) DISPLAY DEVICE WITH IMAGE EXPANSION VIA PERIPHERIAL LIGHT GUIDE ELEMENTS

(75) Inventor: Hisashi Watanabe, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 959 days.

(21) Appl. No.: 12/935,420

(22) PCT Filed: Mar. 27, 2009

(86) PCT No.: PCT/JP2009/001399
§ 371 (c)(1),
(2), (4) Date: Sep. 29, 2010

(87) PCT Pub. No.: WO2009/122691
PCT Pub. Date: Oct. 8, 2009

(65) Prior Publication Data
US 2011/0025594 A1 Feb. 3, 2011

(30) Foreign Application Priority Data
Mar. 31, 2008 (JP) ................................ 2008-092443

(51) Int. Cl.
*G09G 3/00* (2006.01)
(52) U.S. Cl.
USPC .............................................. 345/32; 345/1.3
(58) Field of Classification Search
USPC .................. 345/1.1–111, 156–184, 204–215, 345/690–699
See application file for complete search history.

(56) References Cited

U.S. PATENT DOCUMENTS 3,768,887 A * 10/1973 Portmann ........................ 349/63
3,914,642 A * 10/1975 Coderre et al. ................ 313/514
(Continued)

FOREIGN PATENT DOCUMENTS

JP      2-123989 U    10/1990
JP      6-43479 A     2/1994
(Continued)

OTHER PUBLICATIONS

International Preliminary Report on Patentability and Written Opinion of the International Searching Authority, dated Dec. 23, 2010, for Application No. PCT/JP2009/001399 (Forms PCT/IB/338, PCT/IB/373 and PCT/ISA/237).

(Continued)

*Primary Examiner* — Gene W Lee
(74) *Attorney, Agent, or Firm* — Birch, Stewart, Kolasch & Birch, LLP

(57) ABSTRACT

A direct-viewing type display device 100a includes: a display panel 10 having a display region 31 and a frame region 30 formed outside the display region; and a light guide element 21A having an incident face 21a, an outgoing face 21b, and a plurality of light guide paths formed between the incident face and the outgoing face. The incident face of the light guide element is disposed so as to overlap a portion 32 of a peripheral display region adjoining the frame region of the display panel along the first axis, and be parallel to the surface of the display panel. The outgoing face 21b of the light guide element has a distance from the incident face 21a that increases away from the portion 32 of the peripheral display region and toward the frame region 30 along the first axis, and extends to a position overlapping the frame region 30. According to the present invention, with a structure which is more simple and light-weight than conventionally, there is provided a direct-viewing type display device in which a frame region of a display panel, or a joint in the case of tiling, is obscured.

15 Claims, 10 Drawing Sheets

(56) References Cited

U.S. PATENT DOCUMENTS

| | | | |
|---|---|---|---|
| 5,812,252 A * | 9/1998 | Bowker et al. | 356/71 |
| 6,344,928 B1 * | 2/2002 | Honguh et al. | 359/621 |
| 6,483,482 B1 * | 11/2002 | Kim | 345/3.1 |
| 6,927,908 B2 | 8/2005 | Stark | |
| 7,551,372 B2 * | 6/2009 | Xun et al. | 359/737 |
| 7,592,971 B2 * | 9/2009 | Chang et al. | 345/1.3 |
| 8,073,289 B2 * | 12/2011 | Miller | 382/284 |
| 8,085,216 B2 * | 12/2011 | Miller | 345/1.1 |
| 2004/0051944 A1 * | 3/2004 | Stark | 359/448 |
| 2005/0140613 A1 * | 6/2005 | Lowe et al. | 345/87 |
| 2006/0007054 A1 * | 1/2006 | Chang et al. | 345/1.3 |
| 2006/0077544 A1 * | 4/2006 | Stark | 359/448 |
| 2009/0102862 A1 * | 4/2009 | Miller | 345/634 |
| 2009/0106689 A1 * | 4/2009 | Miller | 715/788 |
| 2009/0122415 A1 * | 5/2009 | Mitani et al. | 359/639 |
| 2009/0304909 A1 | 12/2009 | Daniels | |
| 2009/0309810 A1 * | 12/2009 | Chang et al. | 345/1.3 |
| 2009/0322794 A1 * | 12/2009 | Lowe et al. | 345/690 |
| 2011/0025594 A1 * | 2/2011 | Watanabe | 345/102 |
| 2011/0255301 A1 | 10/2011 | Watanabe | |
| 2013/0135429 A1 | 5/2013 | Lablans | |

FOREIGN PATENT DOCUMENTS

| | | |
|---|---|---|
| JP | 7-128652 A | 5/1995 |
| JP | 9-37194 A | 2/1997 |
| JP | 2000-56713 A | 2/2000 |
| JP | 2001-5414 A | 1/2001 |
| JP | 2003-169271 A | 6/2003 |
| JP | 2004-29629 A | 1/2004 |
| JP | 2004-524551 A | 8/2004 |

OTHER PUBLICATIONS

U.S. Notice of Allowance for co-pending U.S. Appl. No. 13/056,191, Sep. 19, 2013.

* cited by examiner

*FIG.13*
(a)
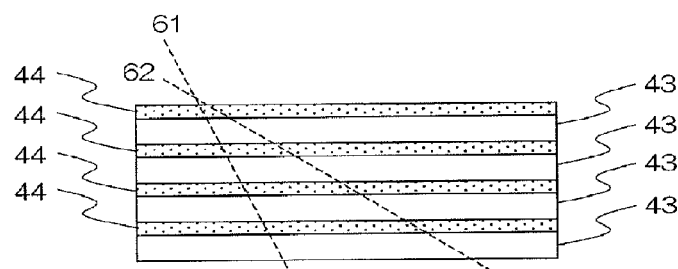
(b)
*FIG.14* WINDING DIRECTION
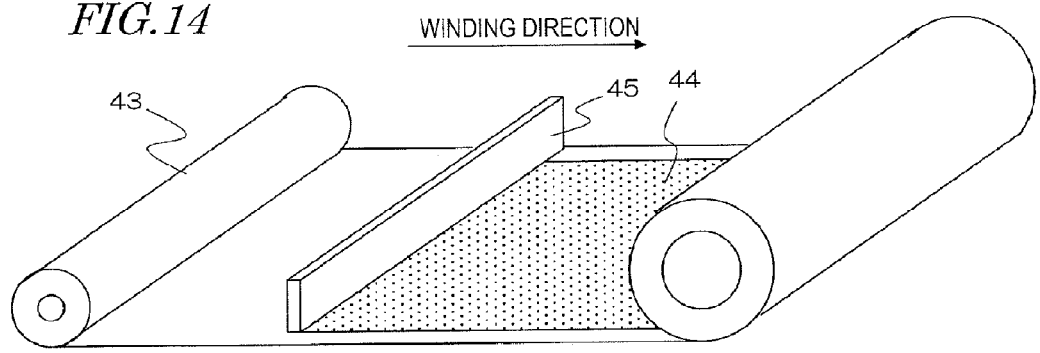
(a)
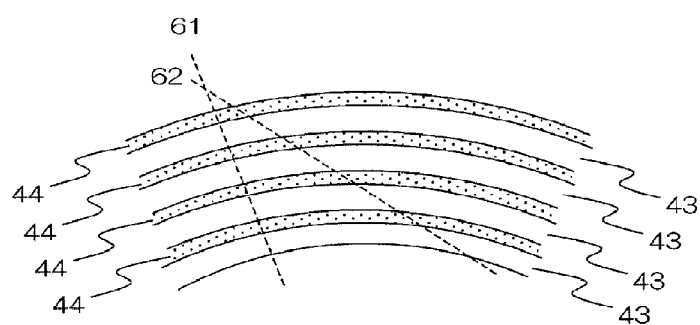
(b)

WINDING DIRECTION

DISPLAY DEVICE WITH IMAGE EXPANSION VIA PERIPHERIAL LIGHT GUIDE ELEMENTS

TECHNICAL FIELD

The present invention relates to a display device, and in particular to a direct-viewing type display device.

BACKGROUND ART

In recent years, there is a strong desire for an increase in the size of television sets and display devices for displaying information. Representative examples of large-sized display devices are display devices in which self-light-emitting elements such as light-emitting diodes (LEDs) are arranged in a matrix array and projection display devices; however, these have disadvantages in terms of image quality. Therefore, a further increase in the size of direct-viewing type liquid crystal display devices (LCDs) and plasma display devices (PDPs), which are capable of displaying with a high image quality, is being desired.

Since a direct-viewing type liquid crystal display device or a plasma display device is basically formed on a glass substrate, its screen size depends on the substrate size. Currently, the largest of glass substrates (mother substrates) that are used for the production of liquid crystal display devices are those of the eighth generation (2200 mm 2400 mm), and liquid crystal display devices whose diagonal is about 100 inches are being produced by using these substrates. The substrates that are available for mass production will become more increased in size, however at a slow rate. It is difficult to immediately provide display devices with the larger areas that are required on the current market.

Therefore, as a method of realizing a large-screen display device, there has been a conventional attempt of realizing a make-believe large-screen display device by arraying a plurality of display devices (which may be referred to as tiling). However, the tiling technique induces a problem of visible joints between the plurality of display devices. This problem will be described by taking a liquid crystal display device for example.

Note that a liquid crystal display device mainly includes a liquid crystal display panel, a backlight device, circuits for supplying various electrical signals to the liquid crystal display device, and a power supply, as well as a housing in which to accommodate these. The liquid crystal display panel is mainly composed of a pair of glass substrates and a liquid crystal layer interposed therebetween. On one of the glass substrates, a color filter layer and a counter electrode are formed, whereas on the other glass substrate, TFTs, bus lines, a driving circuit for supplying signals to them, and the like are formed. The screen size of a direct-viewing type liquid crystal display device is determined by the screen size of the liquid crystal display panel. The liquid crystal display panel has a display region which is composed of a plurality of pixels, and a frame region surrounding it. In the frame region, a sealing portion with which to attach the pair of substrates together and also seal and retain the liquid crystal layer, an implementation of driving circuitry for driving the pixels, and the like are formed.

Thus, since the frame region not contributing to any displaying exists in a liquid crystal display panel, when a large screen is constructed by arraying a plurality of liquid crystal display panels, the image will have joints. This problem is not limited to liquid crystal display devices, but is shared among direct-viewing type display devices, e.g., PDPs, organic EL display devices, and electrophoresis display devices.

Patent Document 1 discloses a construction which includes an optical fiber face plate covering the entire display panel, such that jointless displaying is performed by allowing the light going out from a display region to be guided to a non-display region by the optical fiber face plate.

Patent Document 2 discloses a construction in which an optical fiber face plate complex is provided on the entire display panel, such that jointless displaying is performed by allowing the light going out from a display region to be guided to a non-display region by the optical fiber face plate.

Patent Document 3 discloses a construction including an optical compensation means over substantially the entire display panel, the optical compensation means being composed of a multitude of slanted thin films and a transparent material filled between the slanted thin films, such that jointless displaying is performed by allowing light to be guided to a non-display region by the optical compensation means.

[Patent Document 1] Japanese Laid-Open Patent Publication No. 7-128652
[Patent Document 2] Japanese Laid-Open Patent Publication No. 2000-56713
[Patent Document 3] Japanese Laid-Open Patent Publication No. 2001-5414

DISCLOSURE OF INVENTION

Problems to be Solved by the Invention

Since an optical fiber face plate is an aggregate of optical fibers, it becomes increasingly difficult and costing to produce as it increases in area. The conventional techniques described in Patent Document 1 and Patent Document 2 require an optical fiber face plate covering substantially the entire display panel, and thus are not practical from the standpoint of the production method and cost particularly in large-sized display devices.

The technique described in Patent Document 3 differs from the techniques of Patent Documents 1 and 2 in that an optical compensation means composed of a multitude of slanted thin films and a transparent material filled between the slanted thin films is used, instead of an optical fiber face plate. However, it still requires the optical compensation means covering substantially the entire display panel, thus presenting problems similar to those of the techniques described in Patent Document 1 and Patent Document 2.

Note that Patent Document 2 states that a parallel plate (a fiber face plate whose incident face and outgoing face are parallel) to be disposed in the display region is omissible. However, when the parallel plate is omitted, an end face portion of a block-like (having a rectangular cross section) optical fiber face plate that is disposed at an edge portion of the display region forms a stepped portion within the display region, thus rendering the image discontinuous and detracting from display quality.

The present invention has been made in order to solve the above problems, and an objective thereof is to provide a direct-viewing type display device in which a frame region of a display panel, or a joint in the case of tiling, is obscured, and which is easier to produce or incurs lower cost than conventionally.

Means for Solving the Problems

A display device according to the present invention is a direct-viewing type display device, comprising: at least one display panel having a display region and a frame region formed outside the display region; and at least one light guide element having an incident face, an outgoing face, and a plurality of light guide paths formed between the incident face and the outgoing face, characterized in that the incident face of the at least one light guide element is disposed so as to overlap a portion of a peripheral display region adjoining the frame region of the at least one display panel along a first axis, and be parallel to a surface of the at least one display panel; and the outgoing face of the at least one light guide element has a distance from the incident face that increases away from the portion of the peripheral display region and toward the frame region along the first axis, and extends to a position overlapping the frame region.

In one embodiment, a cross section of the at least one light guide element along the first axis has a shape which is a triangle.

In one embodiment, a cross section of the at least one light guide element along the first axis has a shape which is a substantial isosceles triangle.

In one embodiment, the at least one light guide element includes two light guide elements opposing each other along the first axis of the at least one display panel, the display device further comprising a light-diffusing layer covering the outgoing faces of the two light guide elements.

In one embodiment, the at least one light guide element includes two light guide elements opposing each other along the first axis of the at least one display panel, the display device further comprising a light-transmitting cover covering the display region and the outgoing faces of the two light guide elements. Preferably, the light-transmitting cover has a refractive index which is higher than a refractive index of the plurality of light guide paths.

In one embodiment, the at least one light guide element includes a plurality of optical fibers.

In one embodiment, the at least one light guide element includes a plurality of light guide layers.

In one embodiment, the at least one display panel includes a plurality of pixels arrayed across the entire display region at a predetermined pitch; and display signals supplied to a plurality of pixels existing in the portion of the peripheral display region are compressed along the first axis. Herein, display signals which are supplied to the plurality of pixels existing in the portion of the peripheral display region may be compressed at a constant compression rate or different compression ratios along the first axis, depending on the rate of enlargement by the light guide element.

In one embodiment, a luminance of display light which goes out from the at least one display panel is preferably higher in the portion of the peripheral display region than in any other portion.

In one embodiment, the at least one display panel is a liquid crystal display panel, the display device further comprising a backlight device; and an intensity of light which is emitted from the backlight device toward the portion of the peripheral display region is higher than an intensity of light which is emitted toward any other portion. It will be appreciated that the transmittance of the pixels within the display region of the liquid crystal display panel may be set lower than the transmittance of the pixels of the portion of the peripheral display region. The transmittance of the pixels may be controlled by the signal voltage to be supplied. Moreover, such may be combined with control of the intensity of light which is emitted from the backlight device.

In one embodiment, the at least one display panel includes a plurality of display panels arranged along the first axis.

In one embodiment, in the plurality of display panels, an angle between display planes adjoining each other along the first axis is set to an angle less than 180°. The angle between the display planes adjoining each other along the first axis is 90°, for example.

The plurality of display panels include at least three display panels arranged along the first axis, the at least three display panels being disposed in an annular shape. For example, four display panels may be placed in an annular shape along the inner walls of a room.

In one embodiment, the plurality of display panels are fixed so that an angle between display planes adjoining each other along the first axis is variable.

In one embodiment, the at least one display panel includes a plurality of display panels which are arranged in a matrix array along the first axis and a second axis intersecting the first axis; and the at least one light guide element includes a light guide element whose incident face is disposed so as to overlap another portion of the peripheral display region adjoining the frame region of the at least one display panel along the second axis and be parallel to the surface of the at least one display panel, and whose outgoing face has a distance from the incident face that increases away from the other portion of the peripheral display region and toward the frame region along the second axis and extends to a position overlapping the frame region. The first axis is the horizontal direction, for example, and the second axis is the vertical direction.

In one embodiment, the at least one light guide element further includes a tapered light guide element provided at a corner portion of the display device.

Effects of the Invention

According to the present invention, there can be provided a direct-viewing type display device in which a frame region of a display panel, or a joint in the case of tiling, is obscured, and which is easier to produce or incurs lower cost than conventionally.

BRIEF DESCRIPTION OF DRAWINGS

FIGS. 13 (a) and (b) are schematic diagrams for describing a production method for the sheet laminate 40.

FIGS. 14 (a) and (b) are schematic diagrams for describing another production method for the sheet laminate 40.

Figure 1:
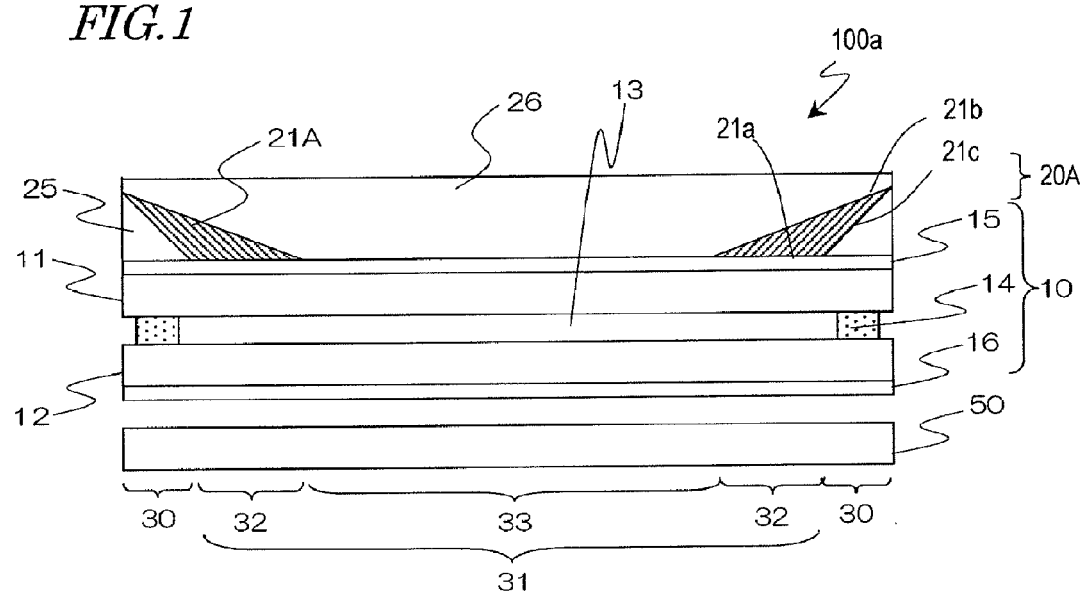
FIG. 1 A schematic cross-sectional view of a liquid crystal display device 100*a* according to an embodiment of the present invention.

DESCRIPTION OF REFERENCE NUMERALS 10 liquid crystal display panel
11 counter substrate
12 TFT substrate
13 liquid crystal layer
14 sealing portion
15, 16 optical film portion
20A light guide sheet
21A light guide element
21a incident face
21b outgoing face
21c side face
25 resin layer
26 cover
30 frame region
31 display region
32 portion of peripheral display region
50 backlight device
100a liquid crystal display device

BEST MODE FOR CARRYING OUT THE INVENTION

Hereinafter, an embodiment of the present invention will be described with reference to the drawings. However, the present invention is not limited to the illustrated embodiment.

Figure 2:
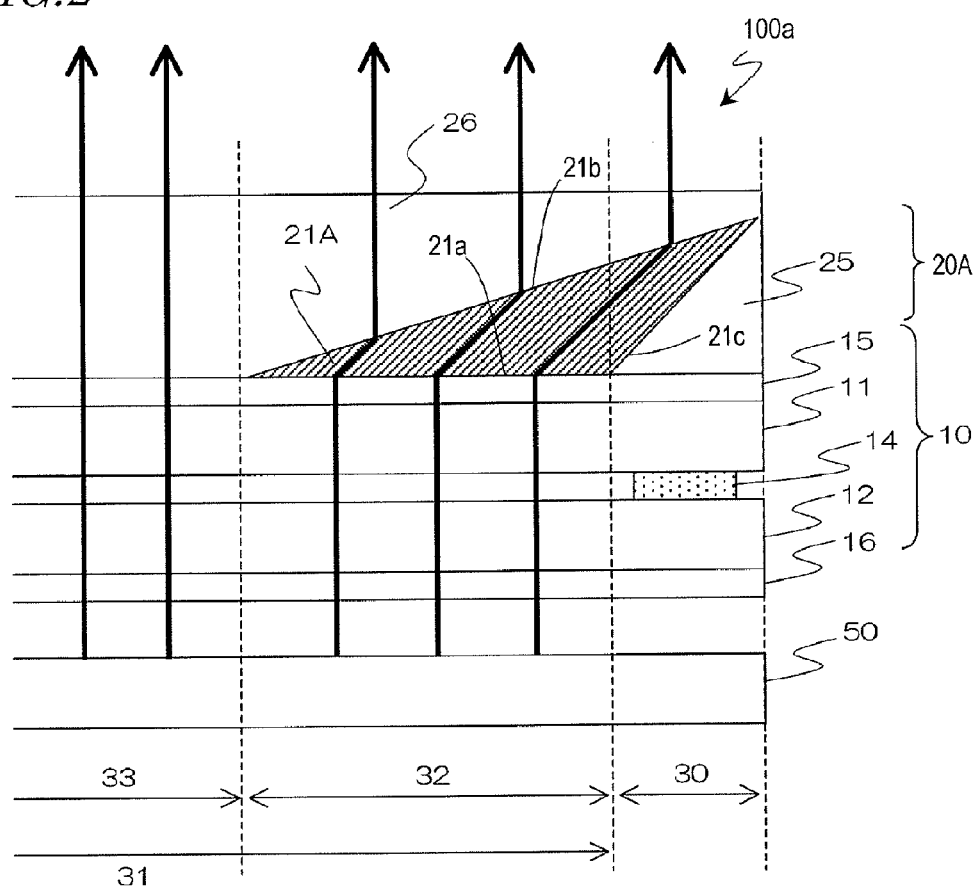
FIG. 2 A schematic cross-sectional view of an end of the liquid crystal display device 100*a*.
Figure 3:
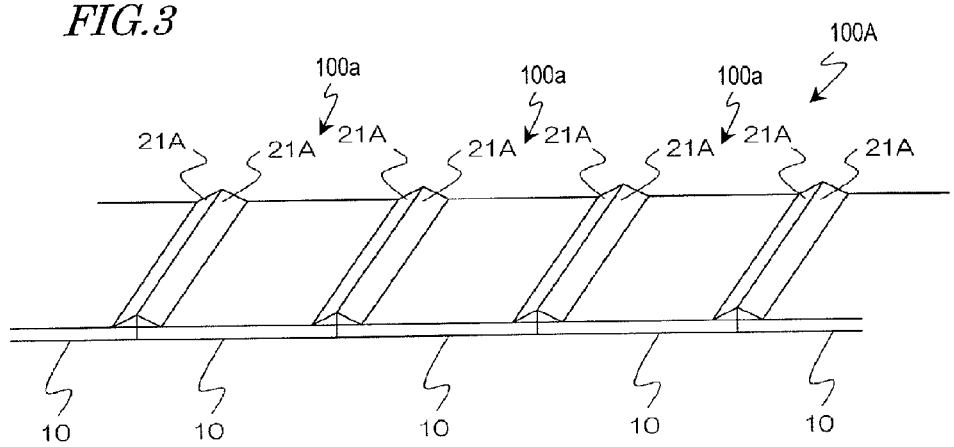
FIG. 3 A schematic perspective view of a liquid crystal display device 100A having a plurality of liquid crystal display devices 100*a* which are arrayed in a single row.

With reference to FIG. 1 to FIG. 3, the construction and operation of a display device according to an embodiment of the present invention will be described. Although a liquid crystal display device in which a liquid crystal display panel is used as the display panel will be illustrated below, this is not a limitation; a display panel for PDP, an organic EL display panel, an electrophoresis display panel, or the like can be used.

FIG. 1 is a schematic cross-sectional view of a liquid crystal display device 100a according to an embodiment of the present invention. FIG. 2 is a schematic cross-sectional view of an end of the liquid crystal display device 100a. FIG. 3 is a schematic perspective view of a liquid crystal display device 100A having a plurality of liquid crystal display devices 100a. The liquid crystal display device 100a can be used alone, or it is possible to obtain the large-sized liquid crystal display device 100A by using a plurality of liquid crystal display devices 100a for tiling as shown in FIG. 3. Note that tiling can be performed with a known method.

As shown in FIG. 1, the liquid crystal display device 100a includes a liquid crystal display panel 10 and two light guide elements 21A, the two light guide elements 21A being disposed on the viewer's side of the liquid crystal display panel 10 and opposing each other along a first axis (which herein is the horizontal direction). The liquid crystal display device 100a is a transmission type, and further includes a backlight device 50, so as to perform displaying by modulating light which is emitted from the backlight device 50 through the liquid crystal display panel 10.

The liquid crystal display panel 10 may be any known liquid crystal display panel, e.g., a VA mode liquid crystal display panel of a TFT type. The liquid crystal display panel 10 includes a counter substrate 11 on which color filters and a counter electrode are formed, a TFT substrate 12 on which TFTs and pixel electrodes are formed, and a liquid crystal layer 13 which is sealed between the pair of substrates 11 and 12 by a sealing portion 14. On surfaces of the substrates 11 and 12 opposite from the liquid crystal layer 13, optical film portions 15 and 16 are respectively provided, each including a polarizer and optionally a phase plate.

The liquid crystal display panel 10 includes a display region 31 composed of a plurality of pixels in a matrix arrangement and a frame region 30 which is formed outside the display region 31. The frame region 30 includes a region in which the sealing portion 14, terminals for various wiring lines, a driving circuit, and the like are formed, and a light shielding film is generally provided on the frame region 30. Therefore, the frame region 30 does not contribute to displaying.

As the backlight device 50, known backlight devices are broadly applicable. For example, a direct-type backlight device in which a plurality of cold cathode ray tubes are arrayed in parallel may be used. However, as will be described later, that which permits adjustment of luminance distribution is preferable.

Each light guide element 21A disposed on the viewer's side of the liquid crystal display panel 10 includes an incident face 21a, an outgoing face 21b, and a plurality of light guide paths formed between the incident face 21a and the outgoing face 21b. The incident face 21a of the light guide element 21A overlaps a portion 32 of a peripheral display region adjoining the frame region 30 of the liquid crystal display panel 10 along the first axis, and is disposed so as to be parallel to the surface of the display panel 10, whereas the outgoing face 21b of the light guide element 21A has a distance from the incident face 21a that increases away from the portion 32 of the peripheral display region and toward the frame region 30 along the first axis, and extends to a position overlapping the frame region 30. It is particularly preferable that the outgoing face 21b extends to a position coinciding with the edge of the liquid crystal display panel 10, as is illustrated herein.

Herein, the first axis is an axis extending along the horizontal direction, and FIG. 1 is a cross-sectional view taken along the first axis. The shape of a cross section of the light guide element 21A along the first axis is a triangle defined by the incident face 21a, the outgoing face 21b, and a side face 21c. The light guide element 21A extends in a direction which is perpendicular to the plane of the figure, and its overall shape is a triangular prism (see FIG. 3).

Each light guide element 21A is an optical fiber face plate composed of a group of optical fibers, for example. As is well known, each individual optical fiber includes a core and a cladding, such that light propagates within the core. That is, the core of each fiber functions as one light guide path. The group of optical fibers which the optical fiber face plate includes are formed so that the length directions of the optical fibers are aligned in parallel. In the cross-sectional view shown in FIG. 1, the optical fibers are arrayed in parallel to the face 21c of each light guide element 21A. Light which enters the light guide element 21A through the incident face 21a propagates within the optical fibers in parallel to the side face 21c, and goes out at the outgoing face 21b toward the viewer's side. Since the outgoing face 21b is provided so as to overlap the frame region 30 of the liquid crystal display panel 10, the liquid crystal display device 100a is able to utilize a region corresponding to the frame region 30 of the liquid crystal display panel 10 for displaying.

The optical fiber face plate to be used as each light guide element 21A can be produced by, from an optical fiber face plate which has been formed in a plate shape, obliquely (with respect to the length direction of the optical fibers) cutting out its incident face and outgoing face so as to define a triangular prism shape. For example, an optical fiber face plate made of quartz (e.g., whose core has a refractive index of 1.8 and whose cladding has a refractive index of 1.5) can be suitably used. It will be appreciated that, the greater the refractive index difference between the core and the cladding is, the more preferable it is, because the numerical aperture (NA) of the optical fiber increases and an increased light transmittance is obtained; however, there is no particular limitation. There is no particular limitation as to the material of the optical fibers, and a transparent resin material such as an acrylic resin may be used. Moreover, in terms of preventing blurring of the displayed image, it is even more preferable to use a fiber face plate having a light absorber for preventing light leaking from within a core from being transmitted to an adjoining core.

Now, with reference to FIG. 2, the reason why the frame region 30 of the liquid crystal display panel 10 is obscured in the liquid crystal display device 100a will be described.

As mentioned above, the incident face 21a of each light guide element 21A is disposed so as to overlap the portion 32 of the peripheral display region which adjoins the frame region 30 of the liquid crystal display panel 10 along the first axis. Therefore, the light going out from the portion 32 of the peripheral display region enters into the light guide element (optical fiber face plate) 21A from the incident face 21a, propagates through the respective light guide paths (optical fibers) which are parallel to the side face 21c, and goes out from the outgoing face 21b. The outgoing face 21b is not parallel to the incident face 21a, but is formed so that its distance from the incident face 21a increases toward the frame region 30, so that the display light (image information) that is incident on the incident face 21a goes out from the outgoing face 21b with enlargement. Therefore, the user of the liquid crystal display device 100a observes an image which is displayed on substantially the entire liquid crystal display panel 10 including the non-display region 30.

In the case where the liquid crystal display device 100a is used alone, a display device which lacks a frame region, or whose frame region is narrower than the frame region 30 of the liquid crystal display panel 10, can be obtained. It will be appreciated that, without being limited to the illustrated case of providing the light guide elements 21A for the two frame regions opposing along the horizontal direction, light guide elements 21A may also be provided for the other two frame regions opposing along the vertical direction, thus adopting a construction where frame regions are eliminated or narrowed on all of the four sides of the liquid crystal display device 100a. Depending on the usage of the liquid crystal display device 100a, the light guide elements 21A may be provided along only one side, or along any arbitrary two or three sides.

In the case where a plurality of liquid crystal display devices 100a are used for tiling, a display device with obscured joints can be obtained by providing light guide elements 21A on the sides of adjoining liquid crystal display devices 100a. For example, by arraying a plurality of liquid crystal display devices 100a in a single row, the liquid crystal display device 100A shown in FIG. 3 can be obtained. Moreover, a liquid crystal display device 100B shown in FIG. 4 can be obtained by arranging, in a matrix array, liquid crystal display devices on whose four sides the light guide elements 21A are provided in a similar manner to the liquid crystal display devices 100a.

Figure 5:
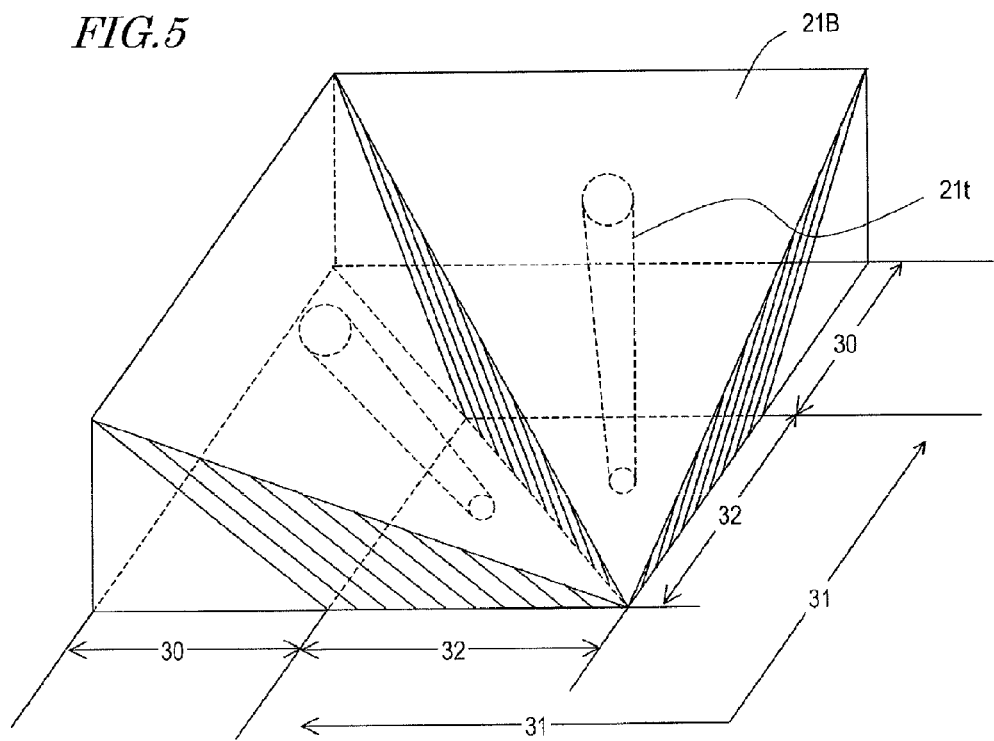
FIG. 5 A schematic perspective view of a tapered light guide element 21B.

At this time, as shown in an enlarged view of FIG. 5, by providing a tapered light guide element 21B in a corner portion, it becomes possible to attain jointless displaying also in the corner portion of the liquid crystal display panel 10. As used herein, tapering refers to a shape such that the cross-sectional area (along a direction which is perpendicular to the direction of light travel) of each light guide path increases away from the incident face and toward the outgoing face. The light guide element 21B can be formed by using fibers 21t whose diameter gradually increases away from the incident face and toward the outgoing face, as schematically shown in FIG. 5, for example. Such a tapered light guide element 21B can also be produced by being cut out from what is obtained by drawing a usual non-tapered fiber face plate with heat application so that the diameter of each fiber varies from place to place.

The light guide element 21B is formed so that its cross sections along lines which are perpendicular to the two orthogonal sides defining the corner and its cross section along a line which divides the corner into two equal parts (the hatched portions in FIG. 5) are the same shape (which herein is a triangle) satisfying the aforementioned condition.

Figure 6:
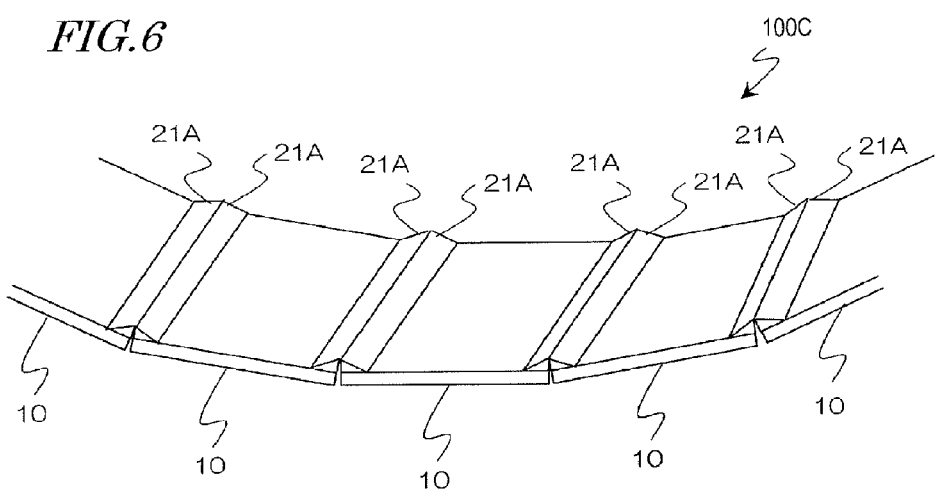
FIG. 6 A schematic perspective view of another liquid crystal display device 100C according to an embodiment of the present invention.

Furthermore, as in the liquid crystal display device 100C shown in FIG. 6, a jointless curved surface type display device can be realized by disposing a plurality of liquid crystal display panels 10 so that the sides of the liquid crystal display panels 10 on which the light guide elements 21A are provided adjoin each other, while allowing them to be tilted by e.g. 10 degrees each. It will be appreciated that, although there is no particular limitation as to the angles between the display planes of the plurality of liquid crystal display panels 10 so long as the sides of the light guide elements 21A are in contact, it is preferable that the constituted angles are less than 180° in terms of obscurity of the vertex angles of the light guide elements 21A. Note that, according to the principles, jointless displaying can also be attained with angles of 180° or more.

Figure 4:
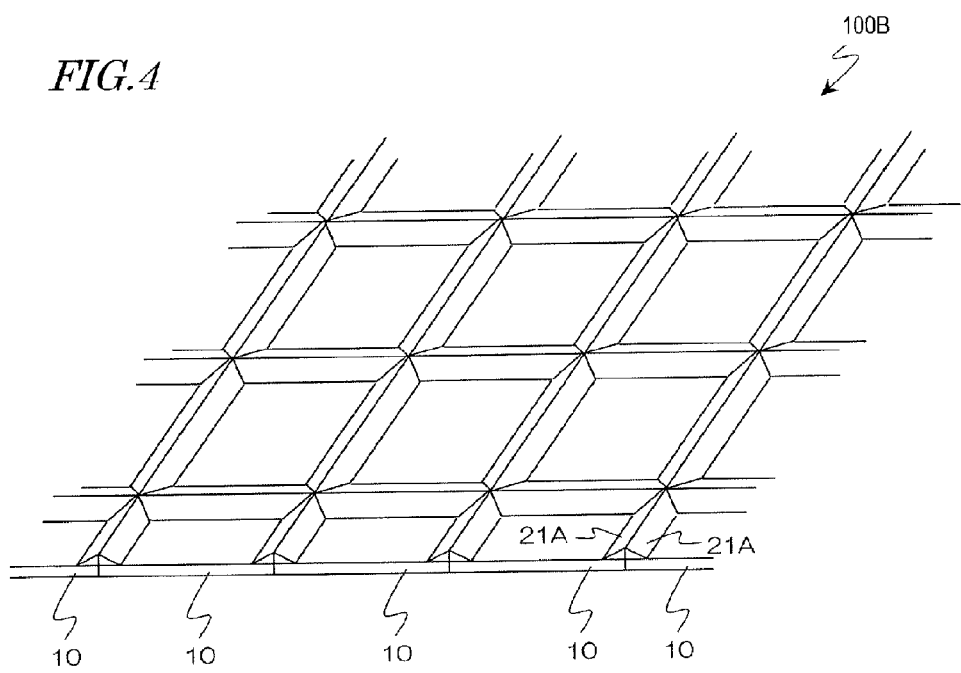
FIG. 4 A schematic perspective view of a liquid crystal display device 100B having a plurality of liquid crystal display devices which are arranged in a matrix array.

In FIG. 3, FIG. 4, and FIG. 6, the backlight device 50 is omitted. For example, in the case where the plurality of liquid crystal display devices 100a are used for tiling, backlight devices 50 may be individually provided for the respective liquid crystal display devices 100a, or a backlight device 50 that is common to some or all of the plurality of liquid crystal display devices 100a composing the liquid crystal display device which is obtained through tiling may be provided. It will be appreciated that the backlight device 50 is not needed in the case where display panels of a self-light-emitting type, e.g., organic EL display panels, are used instead of the liquid crystal display panels 10.

The liquid crystal display device 100a simply includes the light guide elements 21A so as to overlap the portion 32 of the peripheral display region which adjoins the frame region 30 of the liquid crystal display panel 10 and the frame region 30, and does not have the light guide elements 21A in a large part of the display region 31 excluding the portion 32 of the peripheral display region. Thus, there are advantages of easy production and low cost, because an optical fiber face plate having a large area is not required as in the conventional display devices described in Patent Documents 1 to 3 mentioned above. Moreover, not only the liquid crystal display device 100a can realize a display device with a super large screen via tiling, but it also has an advantage of high ease of handling because it can be broken down for easy transportation.

As shown in FIG. 1, the liquid crystal display device 100a further includes a light-transmitting cover 26 which covers the display region 31 of the liquid crystal display panel 10 and the outgoing faces 21a of the two light guide elements 21A (omitted in FIG. 3, FIG. 4, and FIG. 6). The cover 26 and the light guide elements 21A are fixed on the surface of the liquid crystal display panel 10 by a transparent adhesive layer not shown. Each light guide element 21A is further fixed by a resin layer 25 which is formed between the side face 21c and the surface of the liquid crystal display panel 10. Although omissible, the resin layer 25 allows the light guide element 21A to be fixed more stably. The cover 26 is fixed to the outgoing face 21b of the light guide elements 21A by an adhesive layer. The adhesive layer between the light guide elements 21A and the liquid crystal display panel 10 is not necessarily a requirement, and these may be fixed so that an air layer is interposed therebetween.

The light guide elements 21A, the cover 26, and the resin layer 25 provided on the surface of the liquid crystal display panel 10 that is on the viewer's side may be collectively referred to as a light guide sheet 20A. By providing the cover 26 and the resin layer 25, and forming them into a sheet having a flat surface, the light guide elements 21A and the display plane of the liquid crystal display panel 10 can be protected. Moreover, since the surface of the liquid crystal display device 100a is flattened, awkwardness in appearance is reduced. Furthermore, there is also an advantage in that any soil on the surface can be easily wiped off. The cover 26 is a transparent resin plate (e.g., an acrylic resin plate) which is previously formed so as to conform to the shape of the light guide elements 21A and the display plane of the liquid crystal display panel 10, for example.

Providing the cover 26 produces an advantage in that the frontal luminance can be enhanced. The functions of the cover 26 will be described with reference to FIG. 2 and FIG. 7.

Figure 7:
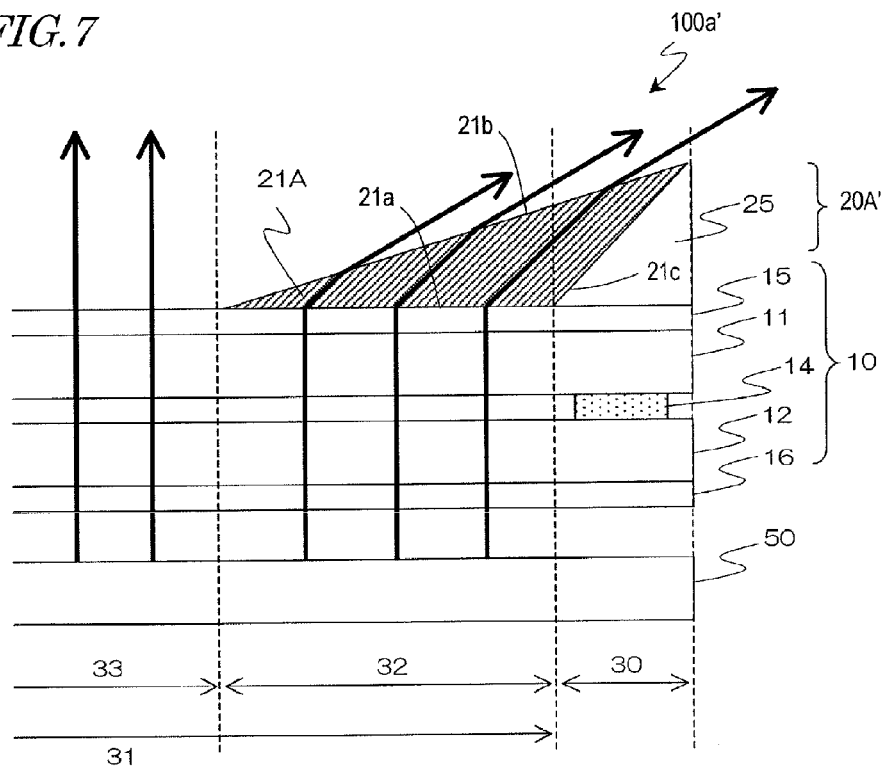
FIG. 7 A schematic cross-sectional view of another liquid crystal display device 100*a*' according to an embodiment of the present invention.

Instead of the light guide sheet 20A of the liquid crystal display device 100a shown in FIG. 2, a liquid crystal display device 100a' shown in FIG. 7 includes a light guide sheet 20A' not having a cover 26.

As shown in FIG. 7, when light having propagated through the light guide elements 21A goes out from the outgoing face 21b, it is refracted in accordance with the refractive index difference between the outgoing face 21b and the exterior. If the cover 26 does not exist, refraction occurs in accordance with a ratio between the refractive index of the light guide elements 21A, e.g., a refractive index of 1.8 of an optical fiber core and a refractive index of 1.0 of air. Therefore, as shown by thick arrows in FIG. 7, it goes out in a direction which is greatly tilted from the frontal direction (the display plane normal direction of the liquid crystal display panel 10). As a result, the frontal luminance of the liquid crystal display device 100a' is lowered. In the case where the cover 26 is not provided, it is preferable to form an antireflection film on the optical fiber face plate and on the display plane of the liquid crystal display panel 10.

On the other hand, when the cover 26 is provided as shown in FIG. 2, refraction at the outgoing face 21b occurs in accordance with a ratio between the refractive index of the light guide elements 21A and the refractive index of the cover 26. Therefore, as compared to the case where the cover 26 does not exist, the amount of light that is emitted in the frontal direction is increased. At this time, if the cover 26 is of a material having the same refractive index as the refractive index of the optical fiber cores, then the decrease in the frontal luminance is minimized because refraction at the outgoing interface is eliminated.

Figure 8:
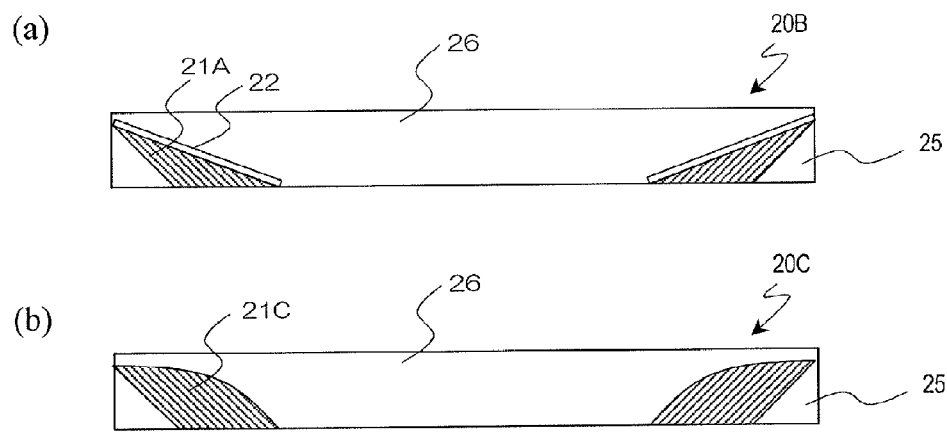
FIGS. 8 (*a*) and (*b*) are schematic cross-sectional views of light guide sheets 20B and 20C to be used in a liquid crystal display device according to an embodiment of the present invention.

Instead of the light guide sheet 20A of the liquid crystal display device 100a shown in FIG. 1, a light guide sheet 20B shown in FIG. 8(a) or a light guide sheet 20C shown in FIG. 8(b) can also be used.

The light guide sheet 20B shown in FIG. 8(a) includes a light-diffusing layer 22 which is formed on the outgoing faces of the light guide elements 21A. By providing the light-diffusing layer 22, light outgoing from the outgoing face is diffused, thus producing an effect of expanding the viewing angle. As the light-diffusing layer 22, a known light-diffusing layer or a light-diffusing element can be used. For example, a scattering film containing microparticles, such as a diffusive tacky sheet manufactured by TOMOEGAWA Co., Ltd., a diffusing layer having a surface with minute bumps and dents randomly formed thereon, such as an anti-glare treatment manufactured by NITTO DENKO CORPORATION, a prism sheet such as BEF from 3M COMPANY, or a light-diffusing element such as a microlens array can be used. It will be appreciated that the light-diffusing element is not limited to one type, but a plurality of methods may be used in combination, e.g., a combination of a prism sheet and a diffusive tacky sheet.

In the case where the light-diffusing layer 22 is provided, since light is diffused in the frontal direction at the outgoing faces of the light guide elements 21A, there is an effect of reducing the aforementioned decrease in frontal luminance. Therefore, even in the case where the cover 26 is not provided, it is preferable to provide the light-diffusing layer 22. Moreover, the light-diffusing layer 22 may be provided so as to cover not only the outgoing faces of the light guide elements 21A but also the display region.

Moreover, as in the light guide sheet 20C shown in FIG. 8(b), light guide elements 21C having a curved surface can be used. The light guide elements 21C can be freely designed in any shape, so long as the thickness increases toward the frame region of the liquid crystal display panel 10.

Furthermore, it is preferable to form an antireflection film on the cover 26. With an antireflection film, the surface reflection of external light can be reduced, thus improving visual recognition. As the antireflection film, a magnesium fluoride ($MgF_2$) thin film, a film on which a low-refractive index resin such as an acrylic resin having fluorine added thereto is applied, a moth-eye antireflection film whose surface reflection has been reduced by forming minute bumps and dents on the sub-wavelength order on its surface, and the like can be used.

Note that, in the case where the distance between the liquid crystal layer 13 of the liquid crystal display panel 10 (see FIG. 1) and the light guide elements 21A is large, or a light-diffusing layer exists therebetween, an image which is seen through the light guide elements 21A may be blurred. Therefore, it is preferable that the thicknesses of the viewer's side substrate 11 of the liquid crystal display panel 10 and the optical film portion 15 are as thin as possible, (e.g., the thickness of the substrate 11 is 0.3 mm; the thickness of the optical film portion 15 is 0.1 mm), and that there is a high transmittance for parallel light (there is little diffusion). For similar reasons, it is preferable to use a material not containing any particles that diffuse light as the adhesive (including a tackiness agent) that is provided on the viewer's side of the liquid crystal display panel 10, e.g., a tacky film included in the optical film portion 15.

Next, a construction for obtaining a more uniform displaying will be described. First, uniformization of luminance will be described.

Within the display light which is emitted from the liquid crystal display device 100a, the display light going out from the portion 32 of the peripheral display region where the light guide elements 21A are disposed is enlarged along the first axis (which is the horizontal direction in the figure) by the light guide elements 21A, and thus will have a lowered luminance depending on its rate of enlargement. Moreover, the luminance is lowered due to the aperture ratio of the light guide elements 21A (the aperture ratio of the optical fiber cores) and the transmission loss of the optical fibers. Therefore, a luminance difference occurs between the region 33 where the light guide elements 21A are not provided and the portion 32 of the peripheral display region where the light guide elements 21A are disposed.

This can be improved by increasing the luminance of the display light going out from the portion 32 of the peripheral display region relative to the other display region 33.

In the case of the liquid crystal display device 100a illustrated herein, the following two methods can be adopted:

Method a: Decrease the transmittance of pixels contained in the display region 33, where the light guide elements 21A are not disposed; and Method b: Increase the intensity of light which is emitted toward the portion 32 of the peripheral display region, where the light guide elements 21A are disposed, so as to be greater than the intensity of the light emitted toward the other portion 33.

Figure 9:
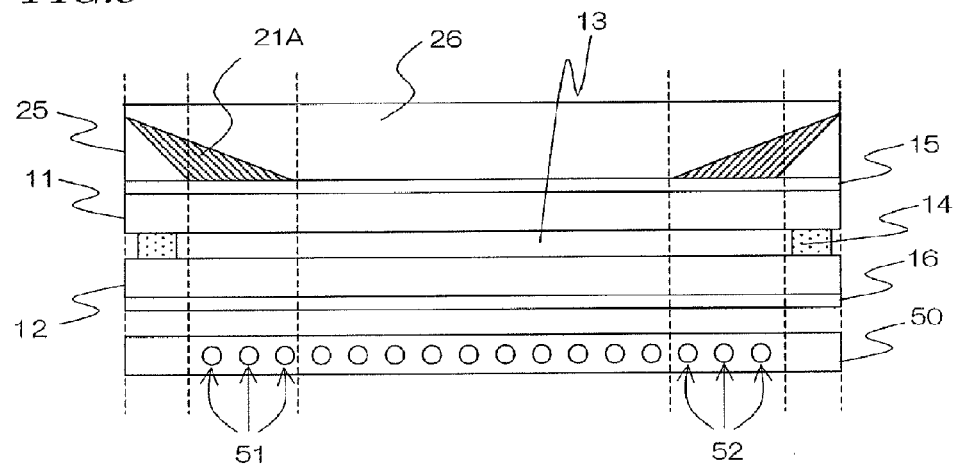
FIG. 9 A schematic cross-sectional view of another liquid crystal display device according to an embodiment of the present invention.

Method a can be easily realized by adjusting the voltages supplied to the pixels. As for Method b, as in a backlight device 50 shown in FIG. 9, for example, cold cathode ray tubes 51 and 52 which are disposed corresponding to the portion 32 of the peripheral display region of the liquid crystal display panel 10 may be lit brighter than the other cold cathode ray tubes. Moreover, a backlight device having light-emitting diodes (LEDs) arranged therein can also be improved by a similar method. It will be appreciated that Methods a and b may be combined for uniformization of luminance.

In the case where the display panel is a self-light-emitting type display panel such as a plasma display panel (PDP) or an organic EL display panel (OLED), the luminance of pixels contained in the display region 33, where the light guide elements 21A are not disposed, may be made relatively small.

Next, uniformization of an image will be described.

As described above, within the display light going out from the liquid crystal display device 100a, the display light going out from the portion 32 of the peripheral display region where the light guide elements 21A are disposed is enlarged (or reduced) along the first axis (which is the horizontal direction in the figure) by the light guide elements 21A. Therefore, in order to realize proper displaying, it is preferable that the image to be displayed in the portion 32 of the peripheral display region is subjected to a previous compression (or enlargement) in accordance with the ratio of enlargement by the light guide elements 21A. There are following two methods of displaying a compressed image. Methods of displaying an enlarged image may only be reversed versions of these, and the descriptions thereof are omitted.

Figure 10:
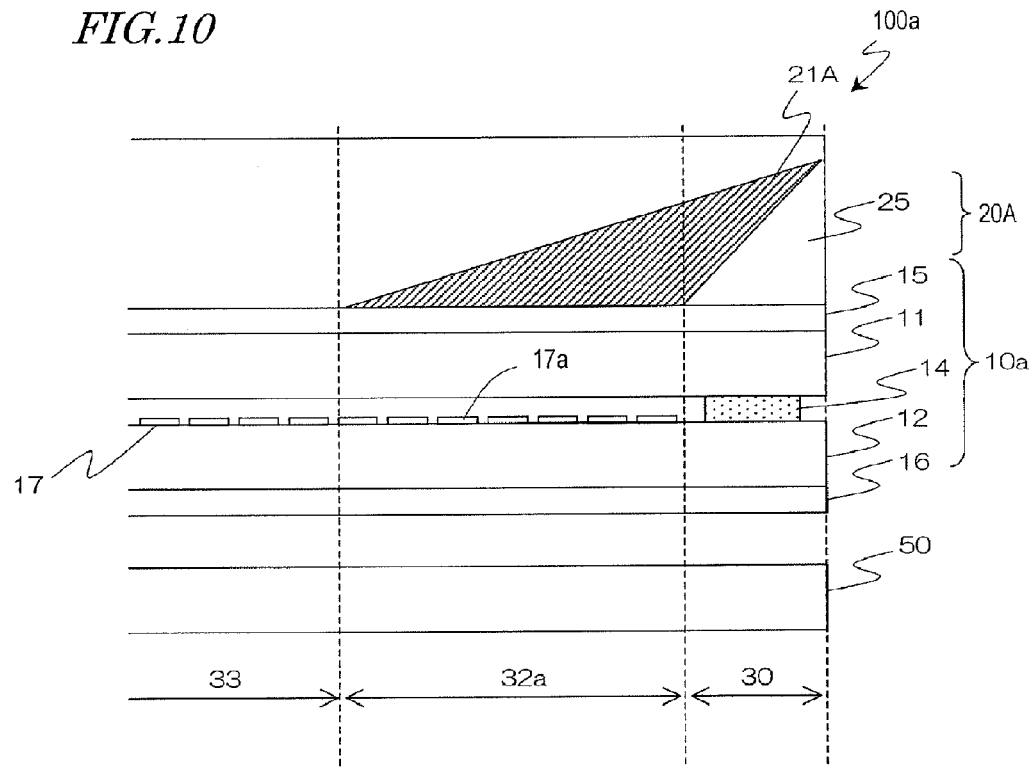
FIG. 10 A schematic cross-sectional view of a liquid crystal display device 100a including a liquid crystal display panel 10 having pixels which are arrayed with a uniform pitch.

Method 1: As in the liquid crystal display device 100a shown in FIG. 10, a method of displaying a compressed image in the portion 32a of the peripheral display region by signal processing, while the pitch of the pixels 17 and 17a is kept constant across the entire display region (33 and 32a) of the liquid crystal display panel 10a. That is, the display signals to be supplied to the plurality of pixels existing in the portion 32a of the peripheral display region are compressed along the first axis. At this time, the display signals to be supplied to the pixels 17a existing in the portion 32a of the peripheral display region are compressed along the first axis at a constant compression rate or different compression ratios, depending on the rate of enlargement by the light guide elements 21A.

Figure 11:
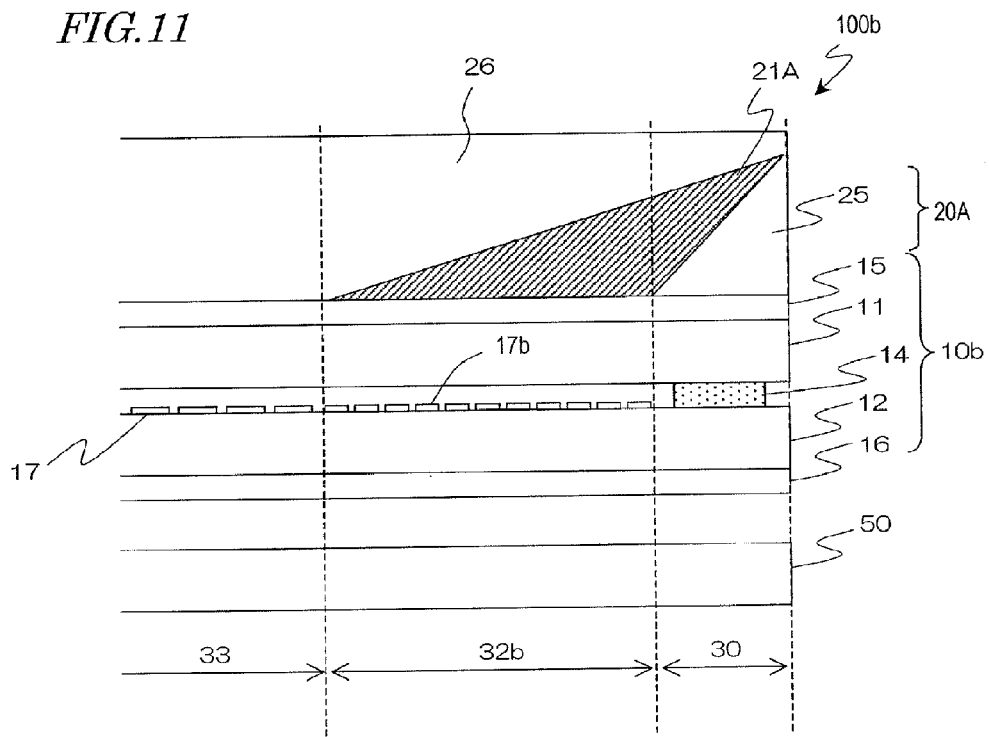
FIG. 11 A schematic cross-sectional view of a liquid crystal display device 100b having a liquid crystal display panel 10b whose pixel pitch is narrower in a peripheral display region than in any other region.

Method 2: A method of, as in a liquid crystal display device 100b shown in FIG. 11, making the pitch of the pixels of the liquid crystal display panel 10b narrower (compressed) for the pixels 17b in the portion 32b of the peripheral display region than the pitch of the pixels 17 in the other region 33, thus displaying a compressed image without performing signal processing. Although Method 2 does not require any special signal processing, it is necessary to previously fabricate specially-designed display panels, thus resulting in problems such as poorer versatility and cost.

On the other hand, Method 1 has an advantage in that commonly-used display panels can be used, although it requires signal processing. In particular, since the display device according to an embodiment of the present invention has an advantage of allowing a tiling technique to be applied with a simple structure by using a displaying unit which is accommodated in a housing, Method 1 will be particularly advantageous as described above. Method 1 can be implemented in software, for example. In the case where the outgoing face 21b of each light guide element 21A is a plane (its cross section is a straight line), the image will be uniformly enlarged, so that a compressed image can be obtained through uniform compression, thus providing an advantage in that signal processing can be simplified. It will be appreciated that, in the case of using the light guide elements 21C having a curved surface as shown in FIG. 8(b), an image may be compressed according to the rate of enlargement by the light guide elements 21C.

Figure 19:
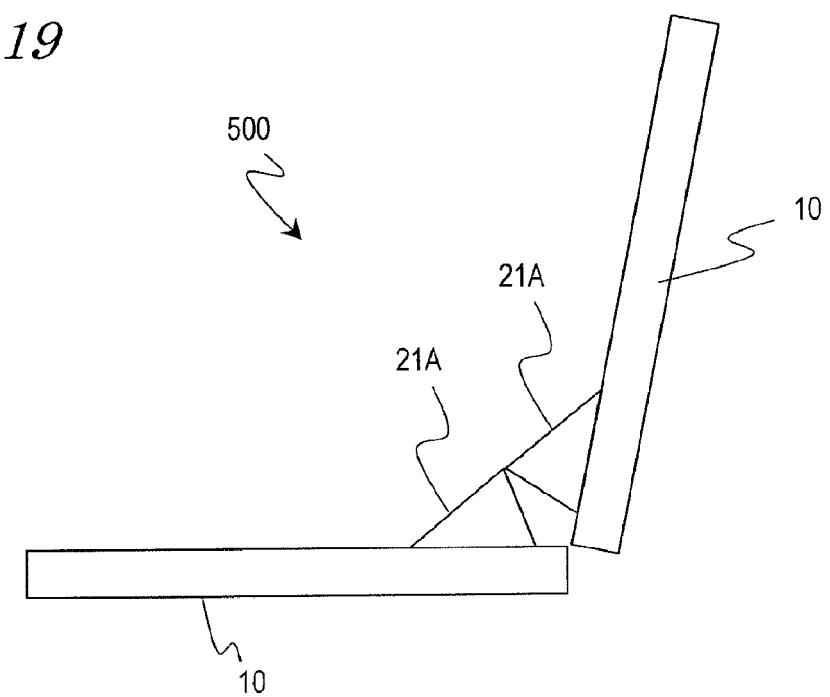
FIG. 19 A schematic cross-sectional view of another display device 500 according to an embodiment of the present invention.

Note that how much an image will be enlarged (or reduced) depends on the lengths of the incident face and the outgoing face of each light guide element 21A along the first axis. In other words, if the length of the outgoing face along the first axis is longer than the length of the incident face along the first axis, an image will be enlarged; and an image will be reduced in the opposite case. Therefore, in a special case where the lengths along the first axis are equal between the incident face and the outgoing face, that is, where a cross sectional shape of each light guide element 21A along the first axis is a substantial isosceles triangle, an image is displayed at its original scale, without being enlarged or reduced, and thus image compression is unnecessary (see FIG. 19).

Figure 12:
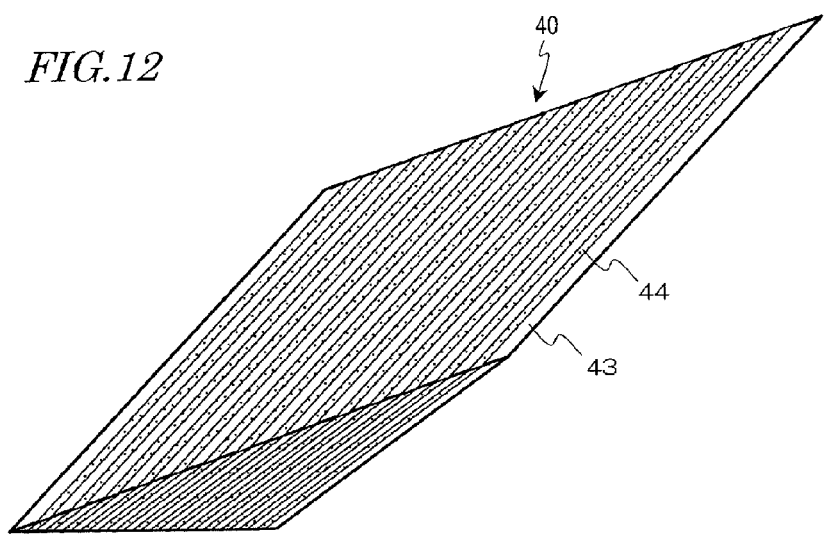
FIG. 12 A perspective view schematically showing the construction of a sheet laminate 40 to be used as a light guide element of a display device according to an embodiment of the present invention.

Although the above embodiment illustrates a construction in which fiber face plates having a plurality of optical fibers are employed as the light guide elements 21A, a sheet laminate 40 having a plurality of light guide layers shown in FIG. 12 can be used as each light guide element 21A.

The sheet laminate 40 is a laminate of at least two or more types of light-transmitting layers having different refractive indices. The light-transmitting layers are stacked in a direction which is perpendicular to the length direction (direction of light propagation), so as to be parallel to one another. Similarly to the light guide elements 21A in FIG. 1, the light-transmitting layers 43 and 44 are disposed so that their length directions coincide with the slant of a line connecting the edge of the display region 31 and the edge of the sheet laminate 40 (which is synonymous to the edge of the display device), thus functioning as a light guide element 21A. For example, a sheet laminate 40 composed of the two types of light-transmitting layers 43 and 44 as shown in FIG. 12 can be used.

The sheet laminate 40 can be easily produced with the following method.

As shown in FIG. 13(a), on one surface of a base 43 composed of a light-transmitting material such as an acrylic resin or glass, a low-refractive index resin 44 containing a fluorine-type compound, which has a lower refractive index than that of the base 43, e.g., Opster (trade name) manufactured by JSR Corporation, is applied, and then is allowed to dry and cure. Next, a plurality of layers of the base are stacked with layers having tackiness or adhesiveness interposed therebetween, and thereafter they are cured in such a manner that the respective layers will not delaminate. As the material having tackiness or adhesiveness, a thermosetting resin, a thermoplastic resin, a UV-curing resin material, or the like can be used; however, its film thickness should preferably be as thin as possible, so long as a high light-transmitting property, little light scattering, and a sufficient strength after curing are obtained. In the case where the base 43 and the resin 44 have tackiness or adhesiveness, there is no particular need to separately provide tacky layers or adhesion layers.

Next, as shown in FIG. 13(b), the laminate obtained in the above manner is cut in oblique directions with respect to the planes of the base 43 and the resin 44, as indicated by broken lines 61 and 62, and the cut surfaces are polished as necessary for an improved exterior appearance, whereby the sheet laminate 40 as shown in FIG. 12 is obtained.

The directions of cutting are parameters to be determined based on the width of the non-display region 30 and the area of the region 32 in which the sheet laminate 40 is to be disposed (see, for example, FIG. 2). The angle between the broken line 61 and the plane direction of the base 43 and the resin 44 was 65 degrees, whereas the angle between the broken line 62 and the plane direction of the base 43 and the resin 44 was 30 degrees.

Figure 15:
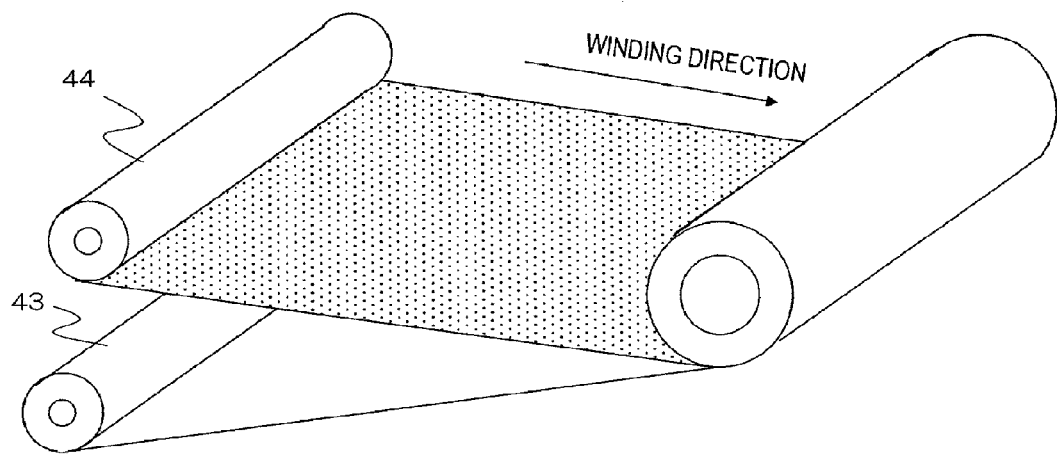
FIG. 15 A schematic diagram for describing still another production method for the sheet laminate 40.

In the case where the base 43 is able to flexibly bend, as in a film base which is composed of a resin material, the production can be further facilitated by using a roll-to-roll method, as shown in FIGS. 14(a) and (b) and FIG. 15.

FIGS. 14(a) and (b) show a first method based on roll-to-roll technique.

First, as shown in FIG. 14(a), on one surface of a film base 43 composed of a flexible light-transmitting material, a resin material 44 having a lower refractive index than that of the base 43 is uniformly applied onto the base 43 by allowing the resin to be discharged through a nozzle 45, using a coating apparatus such as a slit coater, and this is allowed to dry and cure, and thereafter wound onto a roll. As the film base 43, a polyethylene terephthalate (PET) film or an acrylic film can be used, for example. As the resin material having a low refractive index, a resin containing a fluorine-type compound, such as Opster (trade name) manufactured by JSR Corporation, can be used. Next, in an oven or the like, this roll is heated to the softening point of the film base 43 or above, thus permitting fusion between film and film.

Next, as shown in FIG. 14(b), the laminate obtained in the above manner is cut in oblique directions with respect to the planes of the base 43 and the resin 44 as indicated by broken lines 61 and 62, and the cut surfaces are polished as necessary for an improved the exterior appearance, whereby the sheet laminate 40 as shown in FIG. 12 is obtained.

Strictly speaking, the planes of the base 43 and the resin 44 are curved surfaces. However, when the diameter of the roll is made sufficiently larger (e.g., 6 inches in diameter) than the thickness of the sheet laminate 40, the base planes can become approximate to substantial planes. Even if they are in fact curved surfaces, the resultant effect will not be particularly different so long as light is sufficiently guided within the film material. After the laminate is removed from the roll, while applying heat, a pressure may be applied with a press machine or the like to obtain a flat plate, whereby a curved surface shape can be transformed into a planar shape.

Other than the method of fusing a film together, winding onto a roll may be performed via layers having adhesiveness (including tackiness), thus causing a cure without allowing the layers to delaminate.

As a material having tackiness or adhesiveness, a thermosetting resin, a thermoplastic resin, a UV-curing resin material, or the like can be used; however, its film thickness should preferably be as thin as possible, so long as a high light-transmitting property, little light scattering, and a sufficient strength after curing are obtained.

FIG. 15 shows a second method based on roll-to-roll.

A film base 43 composed of a light-transmitting material, e.g., a polyethylene terephthalate (PET) film or an acrylic film, and a film base 44 composed of a fluorine-type compound having a lower refractive index than that of the base 43, e.g., Neoflon from manufactured by DAIKIN INDUSTRIES, ltd., were wound onto a roll in overlay fashion.

Next, in an oven or the like, this roll is heated to the softening point of the film base 43 or the film base 44 or above, thus permitting fusion between film and film.

Thereafter, in a manner similar to the above, the sheet laminate 40 as shown in FIG. 12 is obtained. Again, other than the method of fusing a film together, winding onto a roll may be performed via layers having tackiness or adhesiveness, thus causing a cure without allowing the layers to delaminate.

For example, in a sheet laminate 40 produced by the first roll-to-roll method, light-guiding occurs at the interface between a refractive index of 1.65 of the PET layer and a refractive index of 1.4 of the low-refractive index resin layer containing a fluorine-type compound. In other words, in terms of an optical fiber, the PET layer corresponds to the core, and the low-refractive index resin layer corresponds to the cladding. It will be appreciated that, as the refractive index difference between the core and the cladding increases, the numerical aperture (NA) of the sheet laminate increases, which is preferable because the light transmittance is increased. Moreover, in order to prevent light leaking from the PET layer from entering an adjoining PET layer, it is preferable to stack a light-absorbing layer further outside the low-refractive index resin layer. When light leaking from the PET layer enters an adjoining PET layer, blurring of the displayed image may occur. As the light-absorbing layer, a PET film containing a coloring material or the like can be used, for example.

Next, with reference to FIG. 16 to FIG. 19, various specific examples of the display device according to an embodiment of the present invention will be described.

Figure 16:
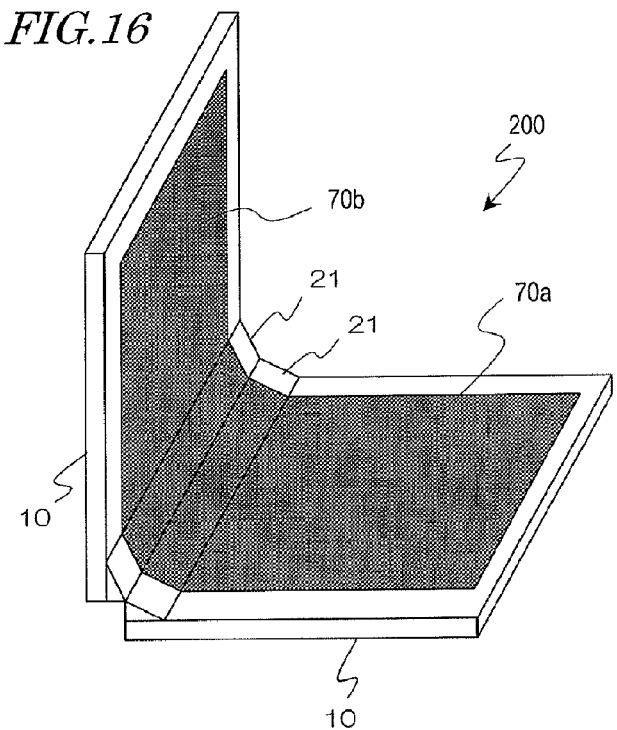
FIG. 16 A schematic perspective view of another display device 200 according to an embodiment of the present invention.
Figure 17:
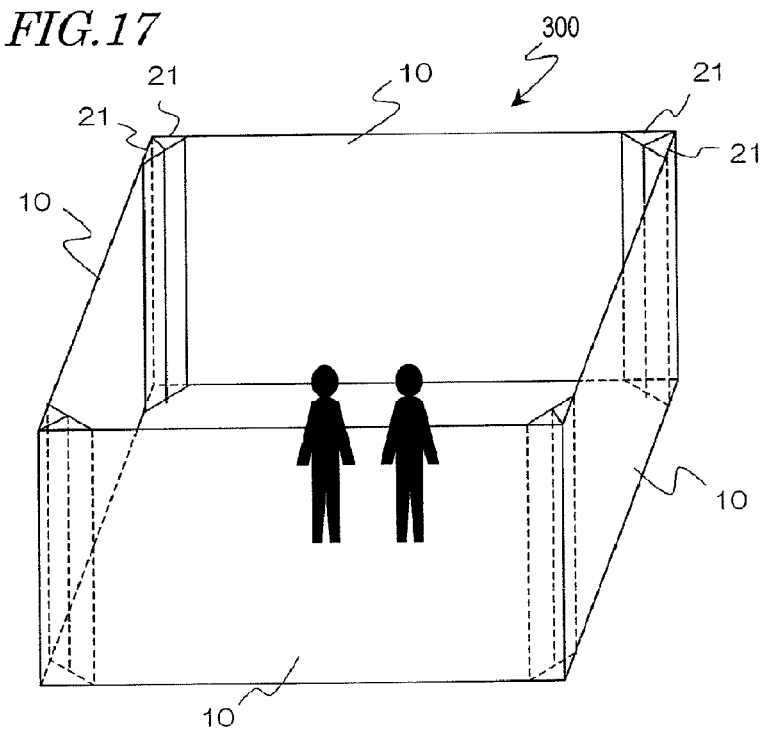
FIG. 17 A schematic perspective view of another display device 300 according to an embodiment of the present invention.

For example, as in a display device 200 shown in FIG. 16, by placing two display panels 10 at 90 degrees in an L-shape, such that their edges (sides) along which the light guide elements 21 are provided abut each other, a display device having jointless L-shaped display regions 70a and 70b can be realized. This is applicable to a display device of an unprecedented design shape, e.g., a sit-up type digital photo frame, or an onboard-type information displaying device. It will be appreciated that the angle between the display planes of the two display panels 10 is not limited to 90 degrees.

By placing at least three display panels 10 in an annular shape along one axis, the entire inner surface can be utilized as a display plane. For example, as in a display device 300 shown in FIG. 17, by placing four display panels 10 in an annular shape along the inner walls of a room, while placing the light guide elements 21 so as to correspond to the corners, the entire inner wall of the room can be covered with a display device. By covering the entire walls of the room with a jointless display device, a display device which realizes a super-high presence can be provided, beyond what can be achieved by a single display device. It will be appreciated that a further enhanced presence will be obtained by also including the ceiling and the floor into the display device. Instead of the display panels 10, liquid crystal display devices 100a as shown in FIG. 1 can also be used, for example.

Figure 18:
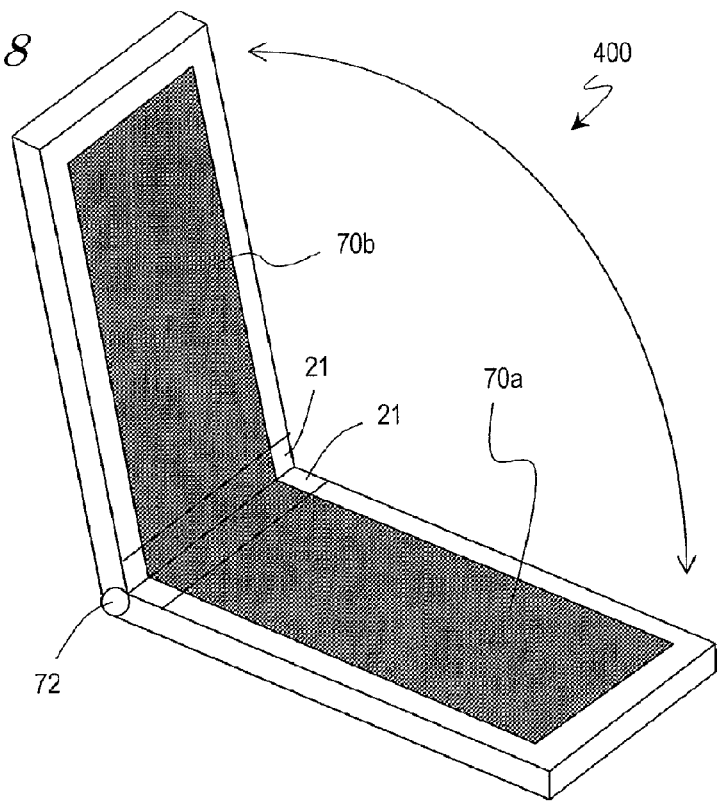
FIG. 18 A schematic perspective view of another display device 400 according to an embodiment of the present invention.

Furthermore, as in a display device 400 shown in FIG. 18, a contact portion between adjoining display panels 10 can be made into a movable section which permits pivoting around an axis 72, whereby the angle between the adjoining display planes 70a and 70b can be made variable. As a result, a display indication on a mobile phone, a game machine, an electronic book, or the like having two screens can be made jointless. Thus, the present invention makes it possible for a small-sized appliance to carry a large-screen display device, thus being very useful.

In order to properly display an image on the display devices 200 to 400 above, it is generally necessary to display an image in a compressed (or enlarged) state, as described above. However, as in a display device 500 shown in FIG. 19, depending on the angle between adjoining display panels 10, it is possible to use light guide elements 21A having a cross-sectional shape which is a substantial isosceles triangle. In this case, the incident face and the outgoing face of each light guide element 21A are substantially equal in length, so that an image is displayed at its original scale, without being enlarged or reduced.

INDUSTRIAL APPLICABILITY

The present invention is suitably used for various direct-viewing type display devices.

The invention claimed is:

1. A direct-viewing type display device comprising:
   at least one display panel having a display region and a frame region formed outside the display region; and
   at least one light guide element having an incident face, an outgoing face, and a plurality of light guide paths formed between the incident face and the outgoing face, wherein
   the at least one light guide element includes a laminate of two or more types of light-transmitting layers having different refractive indices;
   the light-transmitting layers are stacked in a direction which is perpendicular to the direction of light propagation through the light-transmitting layers;
   the incident face of the at least one light guide element is disposed so as to overlap a portion of a peripheral display region adjoining the frame region of the at least one display panel along a first axis, and be parallel to a surface of the at least one display panel; and
   the outgoing face of the at least one light guide element has a distance from the incident face that increases away from the portion of the peripheral display region and toward the frame region along the first axis, and extends to a position overlapping the frame region.

2. The display device of claim 1, wherein a cross section of the at least one light guide element along the first axis has a shape which is a triangle.

3. The display device of claim 1, wherein a cross section of the at least one light guide element along the first axis has a shape which is a substantial isosceles triangle.

4. The display device of claim 1, wherein,
   the at least one light guide element includes two light guide elements opposing each other along the first axis of the at least one display panel, the display device further comprising
   a light-diffusing layer covering the outgoing faces of the two light guide elements.

5. The display device of claim 1, wherein,
   the at least one light guide element includes two light guide elements opposing each other along the first axis of the at least one display panel, the display device further comprising
   a light-transmitting cover covering the display region and the outgoing faces of the two light guide elements.

6. The display device of claim 1, wherein,
   the at least one display panel includes a plurality of pixels arrayed across the entire display region at a predetermined pitch; and
   display signals supplied to a plurality of pixels existing in the portion of the peripheral display region are compressed along the first axis.

7. The display device of claim 6, wherein the display signals supplied to the plurality of pixels existing in the portion of the peripheral display region are compressed along the first axis at different compression ratios.

8. The display device of claim 1, wherein a luminance of display light which goes out from the at least one display panel is higher in the portion of the peripheral display region than in any other portion.

9. The display device of claim 8, wherein,
   the at least one display panel is a liquid crystal display panel, the display device further comprising a backlight device; and
   an intensity of light which is emitted from the backlight device toward the portion of the peripheral display region is higher than an intensity of light which is emitted toward any other portion.

10. The display device of claim 1, wherein the at least one display panel includes a plurality of display panels arranged along the first axis.

11. The display device of claim 10, wherein, in the plurality of display panels, an angle between display planes adjoining each other along the first axis is set to an angle less than 180°.

12. The display device of claim 11, wherein the plurality of display panels include at least three display panels arranged along the first axis, the at least three display panels being disposed in an annular shape.

13. The display device of claim 11, wherein the plurality of display panels are fixed so that an angle between display planes adjoining each other along the first axis is variable.

14. The display device of claim 1, wherein,
the at least one display panel includes a plurality of display panels which are arranged in a matrix array along the first axis and a second axis intersecting the first axis; and
the at least one light guide element includes a light guide element whose incident face is disposed so as to overlap another portion of the peripheral display region adjoining the frame region of the at least one display panel along the second axis and be parallel to the surface of the at least one display panel, and whose outgoing face has a distance from the incident face that increases away from the other portion of the peripheral display region and toward the frame region along the second axis and extends to a position overlapping the frame region.

15. The display device of claim 14, wherein the at least one light guide element further includes a tapered light guide element provided at a corner portion of the display device.

* * * * *